310-322 [redacted] SR
8/30/77 OR 4,045,695

United States Patent [19] [11] 4,045,695
Itagaki et al. [45] Aug. 30, 1977

[54] PIEZOELECTRIC ELECTRO-ACOUSTIC TRANSDUCER

[75] Inventors: Tadasi Itagaki; Kiyonori Iwama; Toshikazu Yoshimi, all of Tokorozawa, Japan

[73] Assignees: Pioneer Electronic Corporation, Tokyo; Tokorozawa Electronic Corporation, Tokorozawa, both of Japan

[21] Appl. No.: 595,631

[22] Filed: July 14, 1975

[30] Foreign Application Priority Data

| | | |
|---|---|---|
| July 15, 1974 | Japan | 49-81287 |
| May 30, 1975 | Japan | 50-64932 |

[51] Int. Cl.$^2$ .......... H01L 41/04
[52] U.S. Cl. .......... 310/322; 310/366
[58] Field of Search .......... 179/110 A; 310/8.5, 310/8.6, 8, 8.1, 9.1-9.4, 8.2, 8.3, 9.5, 9.6

[56] References Cited

U.S. PATENT DOCUMENTS

| | | | |
|---|---|---|---|
| 3,638,052 | 1/1972 | Massa | 310/8.2 |
| 3,745,384 | 7/1973 | Blanchard | 310/8.2 |
| 3,777,192 | 12/1973 | Barrow | 310/8.1 |
| 3,792,204 | 2/1974 | Murayama et al. | 310/8.2 |
| 3,798,473 | 3/1974 | Murayama et al. | 310/8 |
| 3,832,580 | 8/1974 | Yamamuro et al. | 310/9.5 X |
| 3,976,897 | 8/1976 | Tamura et al. | 310/9.4 |
| 3,978,353 | 8/1976 | Kinoshita | 310/8.1 |

OTHER PUBLICATIONS

Electroacoustic Transducers with Piezoelectric High Polymer Films, JAES, Jan./Feb. 1975, vol. 23, No. 1, pp. 21-26 (effective date is 9-10-74 presentation before AES).

*Primary Examiner*—Mark O. Budd
*Attorney, Agent, or Firm*—Blanchard, Flynn, Thiel, Boutell & Tanis

[57] ABSTRACT

An electro-acoustic transducer comprising a flexible film of piezoelectric material, at least one electrode provided on one side of said film and a plurality of electrodes provided on the other side of said film to form a piezoelectric diaphragm and said piezoelectric diaphragm is imparted with a locally differing resiliency and/or tension, is provided. By using this piezoelectric electro-acoustic transducer in a loudspeaker, it is possible to improve acoustic characteristics thereof particularly in a high frequency range, to obtain a variety of acoustic characteristics and to effect motional feed back to minimize distortion of reproduced sound without involving any difficulty in manufacturing or affecting proper performance of the transducer.

2 Claims, 11 Drawing Figures

PIEZOELECTRIC ELECTRO-ACOUSTIC TRANSDUCER

The present invention relates to an electro-acoustic transducer, to be used in a loudspeaker, employing a thin flexible film of piezoelectric material having at least two vibration areas and provided with a locally differing resiliency and/or tension and more particularly to an electro-acoustic transducer, employing a thin flexible film of piezoelectric material, wherein a plurality of electrodes are provided on at least one of the two sides of the film of piezoelectic material and a locally differing resiliency and/or tension is imparted to said piezoelectric diaphragm by fitting a resilient member comprising resilient bodies having properties or sizes different from each other to one of the two sides of the piezoelectric diaphragm to apply different interface contacts or by supporting the piezoelectric diaphragm on a support member having a portion curved with a locally differing curvature, thereby improving frequency characteristics in a hold frequency range, obtaining a variety of acoustic characteristics and effecting motional feed back to minimize distortion of reproduced sound without involving any difficulty in manufacturing or affecting proper performance of the transducer.

It has been proposed to provide a piezoelectric electro-acoustic transducer employing as a diaphragm a thin film which has piezoelectricity. (For example, see U.S. Pat. No. 3,832,580). Such a piezoelectric film to be used as a diaphragm for an electro-acoustic transducer may be prepared by employing a high molecular weight polymer. (See: "Polypeptides Piezoelectric Transducers," by E. Fukuda et al., 6th International Congress on Acoustics, D31, Tokyo, 1968 and "The Piezoelectricity of Poly(vinylidence Fluoride)," by H. Kawai, Japan, J. Appl. Phys. 8, 975, 1969). A conventional piezoelectric electro-acoustic transducer employs a piezoelectric film which has a single electrode bonded or deposited of each of both sides thereof to form a piezoelectric diaphragm, being backed by a resilient backing member or supported by a support member having a curved portion thereon to impart a suitable resiliency and/or tension to said piezoelectric diaghragm.

This type of conventional piezoelectric electro-acoustic transducer has been widely accepted due to its superior acoustic characteristics in a high frequency range.

However, it is customary for music lovers to crave for better sound insatiably and the applicant found that the above mentioned conventional piezoelectric electro-acoustic transducer is not satisfactory yet to meet their request.

Further, the conventional piezoelectric electro-acoustic transducer offers a superior acoustic characteristic in a sense but it is nothing more than a specific acoustic characteristic and it is impossible to vary it. In this respect, too, it can not be expected that the conventional piezoelectric electro-acoustic transducer excites further public interest.

Still further, the conventional piezoelectric electro-acoustic transducer has problems to be solved in adpoting motional feed back to minimize distortion of reproduced sound. In other words, the conventional way of effecting motional feed back in a loudspeaker includes applying a piezoelectric element onto the diaphragm of the loudspeaker, providing a microphone in the vicinity of the diaphragm of the loudspeaker, etc. but in case a piezoelectric element is applied onto the diaphragm of the loudspeaker, difficult problems arise as to selecting a position onto which the element can be applied with ease, minimizing an anticipated adverse effect on proper performance of the diaphragm, etc. and in case a microphone is provided, on the other hand, in the vicinity of the diaphragm, a direct effect can not be expected.

The inventors have made intensive and extensive study of the transducer of this kind and as a result, the present invention has been made to overcome the drawbacks described in the foregoing.

It is therefore an object of the present invention to provide a piezoelectric electro-acoustic transducer having acoustic characteristics further improved in a high frequency range.

It is another object of the present invention to provide a piezoelectric electro-acoustic transducer which is capable of offering a variety of acoustic characteristics.

It is a further object of the present invention to provide a piezoelectric electro-acoustic transducer which can effectively minimize distortion of the reproduced sound by effecting motional feed back without involving any difficulty in manufacturing or affecting proper performance of the piezoelectric electro-acoustic transducer.

Essentially, according to the present invention, there is provided, a piezoelectric electro-acoustic transducer comprising a flexible film of piezoelectric material, at least one electrode provided on one side of said flexible film, a plurality of electrodes provided on the other side of said flexible film and including at least two electrodes confronting, through said flexible film, said electrode provided on one side of the flexible film, thereby forming a piezoelectric diaphragm having at least two vibration areas on said piezoelectric diaphragm, and a means fitted to said vibration areas for imparting resiliency and/or tension to said piezoelectric diaphragm.

The invention will be better understood from the following description taken in connection with the accompanying drawings in which.

Figure 3A:
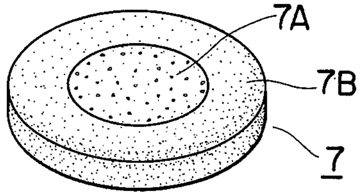
Figure 3B:
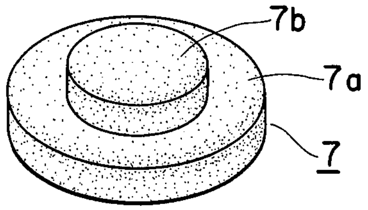
Figure 4:
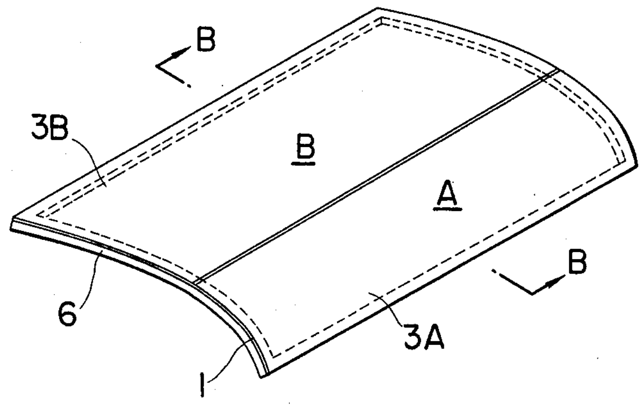
Figure 5:
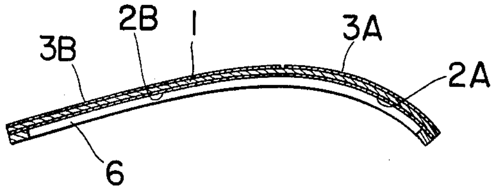
Figure 6:
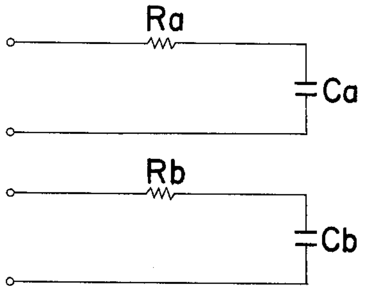
Figure 7A:
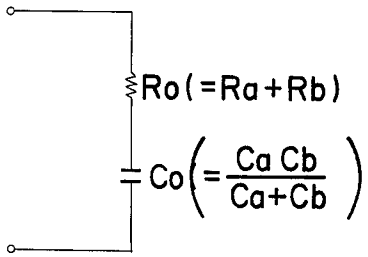
Figure 7B:
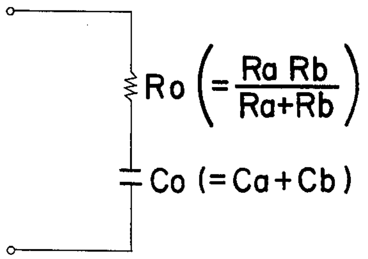
Figure 8:
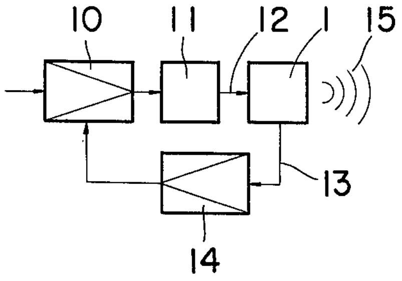

FIG. 3*a* is a perspective view of a resilient backing member comprizing resilient bodies having different properties, respectively;

FIG. 3*b* is a perspective view of a resilient backing member comprising resilient bodies having different sizes, respectively and being piled one on the other;

FIG, 3*c* is an exploded perspective view of a resilient backing member comprising resilient bodies having different sizes, respectively in which the smallest one is sandwiched by the larger ones;

FIG. 4 is a perspective view of another form of the piezoelectric electro-acoustic transducer according to the present invention;

FIG. 5 is a cross sectional view of FIG. 4 taken along the line B—B;

FIG. 6 is a diagram of the equivalent circuits of a peizoelectric electro-acoustic transducer comprising two sets of confronting electrodes;

FIG. 7*a* is a diagram of the equivalent circuit of a piezoelectric electro-acoustic transducer showing the state in which said two sets of the confronting electrodes are connected in series;

FIG. 7*b* is a diagram of an equivalent circuit of the piezoelectric electro-acoustic transducer showing the state in which said two sets of the confronting electrodes are connected in parallel; and FIG. 8 is a block diagram showing a loop in which motional feed back is effected using the piezoelectric electro-acoustic transducer according to the present invention.

In the drawings and the following descriptions like portions or parts are denoted by like numerals or characters.

Figure 1:
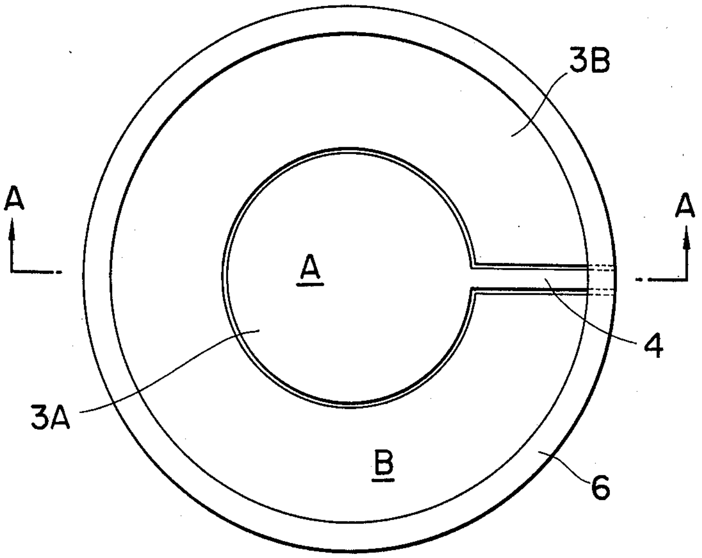
FIG. 1 is a plan view of one form of the piezoelectric electro-acoustic transducer according to the present invention.
Figure 2:
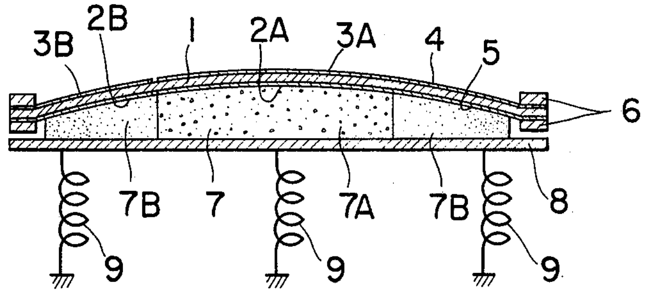
FIG. 2 is a cross sectional view of FIG. 1 taken along the line A—A.

Referring now to FIGS. 1 and 2, there is shown one form of piezoelectric electro-acoustic transducer according to the present invention. Numeral 1 designates a thin film of high molecular weight polymer having a flexibility and subjected to a treatment to have a piezolectricity, such as polyvinylidene fluoride ($PVF_2$), polyvinyl fluoride (PVF), polyvinyl chloride (PVC), etc. Said film 1 is circular and there are bonded or deposited electrodes 2A and 2B on one side of the film 1 and electrodes 3A and 3B on the other side of the film 1. Said electrodes 2A and 3A confront each other across the film 1, forming a vibration area A at the central portion of the film 1 whereas said electrodes 2B and 3B confront each other across the film 1, forming a vibration area B on the film 1. Said vibration area B is nicked as depicted in FIG. 1 to clear the way for lead portions 4 and 5 of the respective electrodes 3A and 2A.

The film 1 and the electrodes 2A, 3A, 2B and 3B form a single piezoelectric diaphragm. The thus formed piezoelectric diaphragm is supported by a support member 6 at its peripheral portion. Furthermore, a resilient backing member 7 is fitted to said piezoelectric diaphragm from one side thereof and said resilient backing member 7 is pressed by a pressing member 8 to impart resiliency and/or tension to the piezoelectric diaphragm. Numeral 9 designates compression springs fixedly attached to the pressing member 8 at one end and a casing (not shown) at the other.

The support member 6 is also fixedly attached to the casing (not shown) so that the resilient backing member 7 may impart resiliency and/or tension to the piezoelectric diaphragm. The support member 6 is made preferably of insulating material. However, if the lead portions 4 and 5 of the respective electrodes 3B and 2B are so constructed that the electrodes 2A and 2B may not be short-circuited and also so that the electrodes 3A and 3B may not be short-circuited, the support member 6 may be of conductive material.

The resilient backing member 7 is made of a resilient synthetic resin such as polyurethane foam etc. In order to impart different resiliency and/or tension to the vibration areas A and B, the resilient backing member is composed of two different resilient bodies 7A and 7B.

According to the present invention, it is essential that the electrode on one side of the film is arranged to confront, through the film, at least two electrodes on the other side of the film regardless of the number of the electrode on one side of the film. Thus, provision of a plurality of vibration areas on the diaphragm can be attained.

Figure 3C:
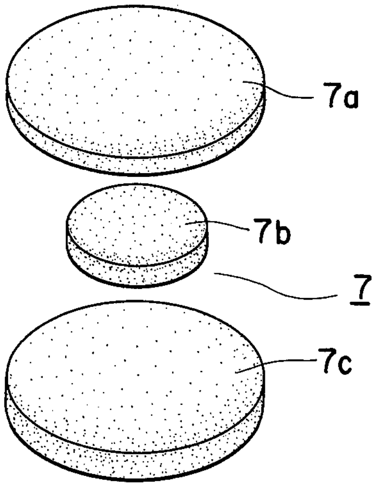

Referring to FIGS. 3*a*, 3*b* and 3*c*, there are shown three forms of the resilient backing member. FIG. 3*a* shows the type used in the embodiment as shown in FIG. 2. This type of resilient backing member comprises two resilient bodies 7A and 7B made of materials different from each other and is so constructed that the resilient body 7A contacts the vibration area A of the piezoelectric diaphragm and the resilient body 7B contacts the vibration area B of the piezoelectric diaphragm when the resilient backing member is fitted to one side of the piezoelectric diaphragm. As shown in FIG. 3*b*, the resilient backing member may comprise resilient bodies 7*a* and 7*b* of the same material, wherein the resilient body 7*b* is piled on the resilient body 7*a* at its central portion. The resilient bodies 7*a* and 7*b* may be integral. In FIG. 3*c*, there is shown a further form of the resilient backing member comprising a resilient body 7*a*, a resilient body 7*b* and a resilient body 7*c*, wherein the smallest resilient body 7*b* is sandwiched by the larger resilient bodies 7*a* and 7*c* at their central portions. By fitting any one of these forms of the resilient backing member to one side of the piezoelectric diaphragm, locally differing resiliency and/or tension is imparted to the piezoelectric diaphragm.

Referring to FIGS. 4 and 5, there is shown another means of imparting resiliency and/or tension to the piezoelectric diaphragm. Illustratively stated, a rectangular piezoelectric diaphragm comprising a film 1 of high molecular weight polymer and electrodes 2A, 3A, 2B and 3B is fixedly supported on a rectangular support member 6 which has two opposing portions curved to impart resiliency and/or tension to the piezoelectric diaphragm.

The piezoelectric electro-acoustic transducer employing this type of support member is disclosed in the U.S. patent application Ser. No. 552,140. Said application discloses two methods for making a transducer with a curved support member. One method involves fixedly attaching the diaphragm to a flat support member and then working the support member into a curved configuration. The other method involves first working the support member into a curved configuration and thereafter fixedly attaching the diaphragm, at its edge portions, to the curved support member. Particularly in the present invention, however, the curvature of the curved portions of the support member 6 is not uniform. Now, there is formed, on a part of the film 1, a rectangular vibration area A by bonding or depositing the electrodes 2A and 3A on the two sides of the film, respectively while on the remaining part of the film 1, there is formed a rectangular vibration area B by bonding or depositing the electrodes 2B and 3B on the two sides of the film, respectively. Said rectangular vibration area A and said rectangular vibration area B are juxtaposed along the opposing curved portions of the support member 6. Since the curvature of the curved portions of the support member 6 is not uniform, the vibration area A and the vibration area B are imparted with different resiliencies and/or tensions, respectively. More particularly, under the first-mentioned method of application Ser. No. 552,140, in referring to FIG. 5 of the present application, bending of the rightward portion of support member 6 tends to increase the tension of the rightward diaphragm portion which was previously secured thereon whereas the tension in the leftward portion of the diaphragm of FIG. 5 remains unchanged since the leftward portion of the support member 6 is not bent from an initial flat condition. With the second method of the referenced application, the rightward portion of the diaphragm may be applied to the already bent support member 6 under a certain degree of tension and tension in the diaphragm can then be increased or decreased as the remaining or leftward portion of the diaphragm is secured to the leftward portion of the support member 6.

In this way, as a means for imparting resiliency and/or tension to the piezoelectric diaphragm, resilient backing members or support members as described in the foregoing are employed. (See: U.S. patent application Ser. No. 549,339, No. 549,341, No. 549,347 and No. 552,140)

Referring to FIG. 6, there is shown an equivalent circuit of the thus constructed transducer. Illustratively stated, Ra and Ca represent a resistance component and a capacitive component, respectively, of the vibration area A which is formed by bonding or depositing the electrodes 2A and 3A on the two sides of a part of the film 1, respectively. Rb and Cb represent a resistance component and a capacitive component, respectively, of the vibration area B, which is formed by bonding or depositing the electrodes 2B and 3B on the two sides of the remaining part of the film 1, respectively.

Furthermore, the vibration areas A and B may be arranged in any manner so long as they are imparted with different properties, respectively, in respect of at least one of resiliency and tension. However, when the piezoelectric electro-acoustic transducer according to the present invention is designed in such a way as shown in FIG. 1 viz. so that the vibration area A, the vibration area B and the support member 6 which are of figures similar to each other are concentrically arranged, highly improved frequency characteristics can be expected due to the harmonized vibration of the transducer attributable to the symmetrical disposition of the vibration areas A and B having vibration bands different from each other. The vibration areas A and B and the support member 6 are circular in FIG. 1 but they may be square, rectangular or oval.

Furthermore, in case motional feed back is effected as will be mentioned later, the size of a vibration area to be used as a sensing means may be smaller than those of the remaining vibration areas.

In operation, by connecting, in series, the confronting electrodes 2A and 3A on the vibration area A and the confronting electrodes 2B and 3B on the vibration area B, it is possible to improve the acoustic characteristics of the transducer in a high frequency range. Illustratively state, FIG. *7a* shows the state in which the confronting electrodes 2A, 3A and the confronting electrodes 2B, 3B are connected in series, wherein Ro represents a whole resistance components and Co represents a whole capacitive component of the piezoelectric electro-acoustic transducer. Supposing each of Ra and Rb is half the value of the resistance component of a conventional piezoelectric electro-acoustic transducer in which a single electrode is bonded or deposited on each of the two sides of the film and each of Ca and Cb is half the value of the capacitive component of such a conventional piezoelectric electro-acoustic transducer, the whole resistance component Ro of the piezoelectric electro-acoustic transducer according to the present invention is equal to the resistance component of the conventional piezoelectric electro-acoustic transducer as seen from the equation $Ro = Ra + Rb$ while the whole capacitive component Co of the piezoelectric electro-acoustic transducer according to the present invention is ¼ of the capacitive component of the conventional piezoelectric electro-acoustic transducer as seen from the equation $$Co = \frac{CaCb}{Ca + Cb}.$$

This decrease of the whole capacitive component as compared with the capacitive component of the conventional piezoelectric electro-acoustic transducer causes the time constant of the piezoelectric electro-acoustic transducer to be reduced. As a result, the sensitivity of the piezoelectric electro-acoustic transducer in response to an input signal is further enhanced in a high frequency range as easily understood to those skilled in the art from the equation $$f = \frac{1}{2\pi\sqrt{CR}}.$$

In addition, this decrease of the whole capacitive component is favorable in view of the fact that it represses tendencies of an amplifier provided in connection with the transducer toward oscillation which might cause noises to generate. The acoustic characteristics of the transducer in a high frequency range is also improved by parallelly connecting, as shown in FIG. *7b*, the confronting electrodes 2A, 3A on the vibration area A and the confronting electrodes 2B, 3B on the vibration area B. In this case, even if a same signal is input both to the electrodes 2A, 3A on the vibration area A and the electrodes 2B, 3B on the vibration area B, sound in a high frequency range is effectively reproduced since the mass of each vibration area is smaller as compared with the conventional transducer in which only one vibration area is provided. It is further observed that sound in a high frequency range is more effectively reproduced at a vibration area whichever has the mass smaller than that of the remaining vibration area, thus substantially improving the acoustic characteristics in high frequency as compared with the conventional piezoelectric electro-acoustic transducer in which each of both sides of the film is covered entirely by a single electrode.

If, in the case of aforementioned series connection, the resilient backing member 7 is fitted to one of the two sides of the piezoelectric diaphragm to impart a locally differing resiliency and/or tension to the diaphragm, the acoustic characteristics in a high frequency range of the transducer which has been improved by the series connection of the electrodes 2A, 3A and the electrodes 2B, 3B is further improved in a high frequency range at a portion where comparatively high resiliency and/or tension in imparted. Similarly, if, in the case of aforementioned parallel connection, the resilient backing member 7 is fitted to one of the two sides of the piezoelectric diaphragm to impart comparatively high resiliency and/or tension to a vibration area whichever has the smaller mass then that of the remaining vibration area, the acoustic characteristics improved in a high frequency range particularly at such a vibration area is even further improved.

Referring again to FIGS. 6, *7a* and *7b*, the extent of improvement in the acoustic characteristics of the piezoelectric electro-acoustic transducer differs between the series connection and the parallel connection of the vibration areas A and B. Similarly, the piezoelectric electro-acoustic transducer according to the present invention shows different acoustic characteristics between the case in which both vibration areas A and B are actuated and the case in which either one of the vibration areas A and B is actuated. Further, when different resistances are connected separately to the respective vibration areas A and B, to wit, different resistances are added to the respective resistance components Ra and Rb, the vibration areas A and B are imparted with different time constants and as a result, the acoustic characteristics of the vibration areas A and B are different from each other. Therefore, it is possible according to the present invention to obtain a variety of acoustic characteristics from a single piezoelectric electro-acoustic transducer, depending upon whether only one of the vibration areas is actuated or both of them are actuated, whether both vibration areas are connected in series or in parallel in case both vibration areas are actuated or depending upon the values of the resistances to be added to the respective resistance components Ra and Rb. It is additionally noted that since it is possible to vary the time constants of the respective vibration areas by adding different resistances to the respective resistance components Ra and Rb, two different bands can be allotted to the vibration areas A and B, respectively, thus constituting a two-way transducer. The thus constituted transducer performs two-way operation not only when a single signal is input thereto but when two signals with different bands obtained through a network are input thereto.

Referring to FIG. 8, there is shown a block diagram of a feed back loop in which motional feed back is effected in order to minimize distortion of the reproduced sound. More specifically, the vibration area A on the film 1 shown in FIG. 1 is supplied with an electrical input signal and actuated, by dint of its piezoelectricity to reproduce sound while the vibration area B, instead of being supplied with an input electrical signal, is used as a sensing means for sensing the reproduced sound. When the vibration area B vibrates in response to the reproduced sound, an electric signal is generated by dint of its piezoelectricity. This electrical signal is fed back to an input electrical signal amplifier 10 through a feed back signal amplifier 14 as a feed back signal 13. Then an input electrical signal modified and amplified at the amplifier 10 is input to the vibration area A through a network 11 as a modified input signal 12. As a result, distortion is minimized in the reproduced sound 15.

In this way, it is possible according to the present invention to improve acoustic characteristics particularly in a high frequency range, obtain a variety of acoustic characteristics with a single transducer and adopt motional feed back in a transducer without being accompanied by any difficulty in manufacturing or affecting proper preformance of the transducer.

What is claimed is:

1. A piezoelectric electro-acoustic transducer comprising a flexible film of piezoelectric material; at least one first electrode provided on one side of said flexible film; a plurality of second electrodes provide on the other side of said flexible film and confronting said first electrode through said flexible film, thereby forming a piezoelectric diaphragm having at least two vibration areas thereon; and a support member supporting said piezoelectric diaphragm at the periphery thereof, wherein said support member is locally bent to form a curved portion the curvature of which differs from that of the remaining portion, and said curved and remaining support member portions correspond to respective first and second said vibration areas of said diaphragm, respectively, such that the differently curved support member portions impart different tensions to the vibration area corresponding to said curved portion and another vibration area corresponding to said remaining portion, respectively.

2. A piezoelectric electro-acoustic transducer in particular for music and the like, comprising:

a flexible diaphragm including a flexible piezoelectric film fixedly supported at the periphery thereof, a first electrode on one side of said flexible piezoelectric film, and a plurality of second electrodes on the other side of said flexible piezoelectric film and confronting said first electrode through said film, two of said second electrodes on said other film side being spaced from each other and being arranged for electrical connection separately, said two second electrodes defining two discrete vibration areas on said film;

support means supporting said flexible diaphragm in a nonplanar rest shape while imparting a limited and differing degree of stiffness to said two discrete vibration areas, said support means thereby including two portions thereof differing in structure and being the support means portions respectively located adjacent said two vibration areas defined by said two second electrodes, said support means portions incorporating means for imparting different time constants to the two vibration areas wherein said transducer is a wide range single diaphragm loudspeaker in which one vibration area of said diaphragm is the more effective for reproduction of frequencies in the lower part of said range and a second said vibration area of said diaphragm is the more effective for reproduction of frequencies in the upper part of said range.

* * * * *